(12) United States Patent
Pu et al.

(10) Patent No.: US 8,058,100 B2
(45) Date of Patent: Nov. 15, 2011

(54) METHOD FOR FABRICATING CHIP SCALE PACKAGE STRUCTURE WITH METAL PADS EXPOSED FROM AN ENCAPSULANT

(75) Inventors: Han-Ping Pu, Taichung (TW);
Chien-Ping Huang, Taichung (TW);
Cheng-Hsu Hsiao, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 12/788,772

(22) Filed: May 27, 2010

(65) Prior Publication Data
US 2010/0233855 A1    Sep. 16, 2010

Related U.S. Application Data

(62) Division of application No. 11/891,134, filed on Aug. 8, 2007, now Pat. No. 7,750,467.

(30) Foreign Application Priority Data

Dec. 12, 2006 (TW) .............................. 95146383 A

(51) Int. Cl.
*H01L 21/60* (2006.01)
(52) U.S. Cl. ................. 438/108; 438/464; 257/E21.503
(58) Field of Classification Search .............. 257/E23.04
See application file for complete search history.

(56) References Cited

U.S. PATENT DOCUMENTS

| | | | |
|---|---|---|---|
| 5,892,179 A | 4/1999 | Rinne et al. | |
| 6,103,552 A | 8/2000 | Lin | |
| 6,271,469 B1 | 8/2001 | Ma et al. | |
| 6,287,893 B1 | 9/2001 | Elenius et al. | |
| 6,350,668 B1 | 2/2002 | Chakravorty | |
| 6,433,427 B1 | 8/2002 | Wu et al. | |
| 7,002,245 B2 | 2/2006 | Huang et al. | |
| 2004/0241039 A1 | 12/2004 | Hwang | |
| 2006/0006760 A1* | 1/2006 | Namba et al. | 310/313 R |
| 2008/0265440 A1 | 10/2008 | Mahler | |

FOREIGN PATENT DOCUMENTS

WO    2006/005304    1/2006

* cited by examiner

*Primary Examiner* — Stephen W Smoot
(74) *Attorney, Agent, or Firm* — Peter F. Corless; Steven M. Jensen; Edwards Wildman Palmer LLP

(57) ABSTRACT

A chip scale package structure and a method for fabricating the same are disclosed. The method includes forming metal pads on a predetermined part of a carrier; mounting chips on the carrier, each of the chips having a plurality of conductive bumps soldered to the metal pads; forming an encapsulant on the carrier to encapsulate the chips and the conductive bumps; removing the carrier to expose the metal pads and even the metal pads with a surface of the encapsulant; forming on the encapsulant a plurality of first conductive traces electrically connected to the metal pads; applying a solder mask on the first conductive traces, and forming a plurality of openings on the solder mask to expose a predetermined part of the first conductive traces; forming a plurality of conductive elements on the predetermined part; and cutting the encapsulant to form a plurality of chip scale package structures.

14 Claims, 8 Drawing Sheets

METHOD FOR FABRICATING CHIP SCALE PACKAGE STRUCTURE WITH METAL PADS EXPOSED FROM AN ENCAPSULANT

CROSS-REFERENCE TO RELATED APPLICATION(S)

This application is a divisional of application U.S. Ser. No. 11/891,134, filed on Aug. 8, 2007, now U.S. Pat. No. 7,750,467.

BACKGROUND OF THE INVENTION

1. Field of the Invention

The present invention generally relates to a semiconductor package structures, and more specifically, to a chip scale package structure and a method for fabricating the same.

2. Description of Related Art

Along with the advancement of the semiconductor technology, semiconductor products have been developed in a variety of different package types. In the pursuing of a lighter, thinner and smaller semiconductor package structure, a chip scale package (CSP) structure has been developed. The feature of this chip scale package structure is that its size is equal to or a little bit bigger than the chip size.

U.S. Pat. Nos. 5,892,179, 6,103,552, 6,287,893, 6,350,668, and 6,433,427 disclose a conventional CSP structure, which applies build-up layers directly on the top of the chip without using a chip carrier such as a substrate or a lead frame, and by means of the redistribution layer (RDL) technology to redistribute the bond pads of the chip to the intended positions. As shown in FIG. 1, this CSP structure has a build-up layer formed on an active surface 100 of a chip 10. The build-up layer comprises a dielectric layer 11 applied on the active surface 100 of the chip 10 and provided with a plurality of through holes 110 for exposing a plurality of bond pads 101 disposed on the chip 10, and a circuit layer 12 formed on the dielectric layer 11 and electrically connected to the exposed bond pads 101. A solder mask 13 is further applied on the circuit layer 12. The solder mask 13 is provided with a plurality of openings 130 for exposing a predetermined part of the circuit layer 12, allowing the predetermined part to be electrically connected to a plurality of solder balls 14, which are used as the input/output ends for electrical connections to external electronic devices.

However, the disadvantage of the aforementioned CSP structure is that the application of the redistribution technology or the distribution of the conductive traces on the chip is always restricted by the size of the chip or its active surface area, especially in the situation that the chip integration level is getting higher and the chip size is getting smaller, the chip can not even provide enough or more surface for installing higher number of solder balls for effectively electrically connecting to external devices.

In view of the aforementioned drawback, U.S. Pat. No. 6,271,469 discloses another package structure that forms a build-up layer on the chip, which provides more surface area to carry more input/output ends or solder balls. As shown in FIG. 2, a package structure uses an encapsulant 25 to encapsulate an inactive surface 202 and a lateral 203 of a chip 20, but leaves an active surface 200 of the chip 20 be exposed. The active surface 200 is at the same level as a surface 250 of the encapsulant 25. A first dielectric layer 26 is applied on the active layer 200 of the chip 20 and the surface 250 of the encapsulant 25. The first dielectric layer 26 is provided with a plurality of through holes 260 made by a laser drilling technique. A first circuit layer 22 is applied on the first dielectric layer 26 and electrically connected to exposed bond pads 201. A second dielectric layer 27 is applied on first circuit layer 22 and is provided with a plurality of through holes 270 for exposing a predetermined part of the first circuit layer 22. A second circuit layer 28 is formed on the second dielectric layer 27 and electrically connected to the exposed predetermined part of the first circuit layer 22. A solder mask 23 is applied on the second circuit layer 28 and is provided with a plurality of predetermined part of the second circuit layer 28, allowing the predetermined part of the second circuit layer 28 to be electrically connected to a plurality of solder balls 24. Therefore, the surface 250 of the encapsulant 25 that encapsulates the chip 20 provides a surface area larger than that the active surface 200 of the chip 20 can provide for installing more solder balls 24 to effectively electrically connect to external devices.

However, the package structure of the aforementioned disclosure has its drawback, when open the plurality of via holes that go through the first dielectric layer to expose the bond pads of the chip by means of laser drilling technology, the plurality of bond pads of the chip are covered by the first dielectric layer, generally it is difficult to aim the laser beam accurately at the solder pad position, consequently the via holes opened can not be aligned accurately to the corresponding bond pad position; since the bond pads of the chip can not completely exposed, it is difficult to ensure the electricity connection quality between the circuit layer and the bond pads, thereby hurting the yield and reliability of the finished products. Meanwhile, the applying of the first dielectric layer on the tops of the chip and the encapsulant as well as the application of the laser drilling technology increase the production cost and fabrication complexity, and the first dielectric layer has different coefficient of thermal expansion (CTE) from the chip and the encapsulant, in a high temperature environment or a heat circulation situation, the first dielectric layer will produce different thermal stress from the chip and the encapsulant and consequently the interface between them will delaminate, thereby leveling down the quality and reliability of the finished products.

Please further refer to FIGS. 3A through 3D. To overcome the aforementioned drawbacks, a CSP structure and its fabrication method is disclosed according to U.S. Pat. No. 7,002,245, wherein, as shown in FIG. 3A, first preparing a wafer that has a plurality of chips, an active surface of each chip 30 having a plurality of bond pads 301. Then forming a conductive bump 31 on each of the bond pads 301, cutting the wafer into a plurality of chips, each of which has a plurality of conductive bump 31. As shown in FIG. 3B, attaching each chip 30 on an adhesion tape 36 via its conductive bumps, and then forming an encapsulant 35 that encapsulates the chips 30 and the conductive bumps 31. As shown in FIG. 3C, removing the adhesion tape 36 to have the end of each conductive bump 31 be uncovered from the encapsulant 35 and be on the same level as one surface of the encapsulant 35, and then forming a plurality of conductive traces 32 on the surface of the encapsulant 35 and electrically connected the conductive traces 32 to the uncovered ends of the conductive bumps 31. As shown in FIG. 3D, applying a solder mask on the conductive traces 32, and then uncovering a plurality of predetermined parts of the conductive traces 32 from the solder mask 33 for mounting a plurality of solder balls 34. Lastly, cutting the encapsulant 35 to form a plurality of semiconductor packages of single isolated chip.

However, the aforementioned fabrication method of CSP structure is using a batch-type method to attach a plurality of chips, which have conductive bumps, on an adhesion tape in an array layout, thus it is difficult to accurately control the relative attach position for each chip due to the machine inaccuracy or other factors, namely, it can not accurately control the positions of the ends of the conductive bumps of the chip uncovered from the encapsulant, meanwhile, the attach positions of the plurality of chips on an adhesion tape is different from the corresponding attach positions of the plurality of chips on another adhesion tape, therefore, it can not accurately align the relative positions between one another, thus in the subsequent process of removing the adhesion tape and patterning process that forms the conductive traces on the top of encapsulant for electrically connecting to the uncovered ends of the conductive bumps, it must go through each individual step of exposing and developing for each batch of the plurality of chips, therefore, it increases the production cost, and practically it can not effectively process mass production.

Hence, it is a highly urgent issue in the industry for how to provide a chip scale package structure and its fabrication method which is capable of ensuring the electricity connection quality between the circuit layer and the bond pads, enhancing the yield and the reliability of the finished products, and meanwhile decreasing the production cost and simplifying the fabrication process.

SUMMARY OF THE INVENTION

In views of the aforementioned drawbacks of the prior art, it is a primary objective of the present invention to provide a chip scale package structure and a method for fabricating the same, wherein in the batch process, the relative positions of the chips mounted on the carrier are identical.

It is another objective of the present invention to provide a chip scale package structure and a method for fabricating the same, wherein in the batch process, the relative positions of the chips in each batch are identical.

It is a further objective of the present invention to provide a chip scale package structure and a method for fabricating the same, which is capable of carrying on pattering circuit process of a plurality of chips from different batches at the same time.

It is still another objective of the present invention to provide a chip scale package structure and a method for fabricating the same, which is capable of processing mass production of chip scale package structures at low cost.

To achieve the aforementioned and other objectives, a chip scale package structure and a method for fabricating the same are provided according to the present invention. The method includes providing a carrier and forming a plurality of metal pads on a predetermined part of a surface of the carrier; mounting a plurality of chips on the carrier, each of the chips having a plurality of conductive bumps soldered to the metal pads; forming an encapsulant on the carrier to encapsulate the chips and the conductive bumps; removing the carrier to expose the metal pads and even the metal pads with a surface of the encapsulant; forming on the surface of the encapsulant a plurality of first conductive traces electrically connected to the metal pads; applying a solder mask on the first conductive traces, and forming a plurality of openings on the solder mask to expose a predetermined part of the first conductive traces; forming a plurality of conductive elements on the exposed predetermined part of the first conductive traces; and cutting the encapsulant to form a plurality of chip scale package structures.

Forming a plurality of metal pads on a predetermined part of a surface of the carrier includes forming a resistance layer on the carrier, and forming a plurality of openings on the resistance layer to expose a part of the carrier; forming a metal pad in each of the openings; and removing the resistance layer, so as to form the metal pads on the predetermined part of the carrier.

By means of the aforementioned fabrication methods, the present invention further discloses a chip scale package structure, which includes a chip having an active surface and an inactive surface opposing to the active surface, a plurality of conductive bumps being formed on the active surface, a metal pad being formed on an end of each of the conductive bumps; an encapsulant encapsulating the chip and the conductive bumps, the metal pads formed on the ends of the conductive bumps being exposed outside from the encapsulant and being on the same level as a surface of the encapsulant; a plurality of first conductive traces formed on the encapsulant and electrically connected to the metal pads; a solder mask applied on the first conductive traces and having a plurality of openings, predetermined parts of the first conductive traces being exposed through the openings; and a plurality of conductive elements formed on the exposed predetermined parts of the first conductive traces.

In addition, according to the present invention, the encapsulant can further be ground to expose the inactive surface of the chip, thereby enhancing the heat dissipation efficiency; furthermore, it can apply at least a dielectric layer and a plurality of second conductive traces between the first conductive traces and the solder mask, thus enhances the flexibility of the first conductive traces layout of the package structure.

Therefore, the chip scale package structure and a method for fabricating the same according to the present invention mainly first form a plurality of well-aligned metal pads on the predetermined positions of the carrier, thus the relative position of each metal pad can be accurately located, next, mount a plurality of chips on the carrier, wherein each chip has a plurality of conductive bumps, and by soldering the conductive bumps to the corresponding metal pads of the carrier, each of the chips is accurately aligned on the carrier, thereby giving the benefit to the subsequent fabrication process, and accordingly avoiding the problems of high production cost, complicated fabrication process, and the practical incapability of effective mass production, etc, according to the fabrication method of the chip scale package structure of the prior art, wherein, it uses the batch-type method to attach a plurality of chips, which have conductive bumps, on an adhesion tape in an array layout, accordingly it can not accurately control the relative attach position for each chip due to the machine inaccuracy or other factors, meanwhile, the attach positions of the plurality of chips on an adhesion tape are different from the attach positions of the plurality of chips on another corresponding adhesion tape, therefore, it can not accurately align the relative positions between one another, thus in the subsequent process of removing the adhesion tape and the patterning process that forms the first conductive traces on the top of the encapsulant for electrically connecting to the uncovered ends of the conductive bumps, it must go through each of the individual steps of exposing and developing for each batch of the plurality of chips.

Next proceed to the encapsulation process, form an encapsulant that encapsulates the plurality of chips and the conductive bumps on the carrier, and then remove the carrier to have the plurality of metal pads be uncovered from the encapsulant and be on the same level as one surface of the encapsulant, and on the surface of the encapsulant, form a plurality of first conductive traces that electrically connect to the metal pads, and also apply a solder mask on the top of the plurality of first conductive traces, then open a plurality of apertures that go through the solder mask to expose a plurality of predetermined parts of the first conductive traces, next, form a plurality of conductive elements on the top of the exposed predetermined parts of the first conductive traces, at last, cut the encapsulant to form a plurality of chip scale package structure, thus reach the goal of sufficient mass production.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Please refer to FIGS. 4A through 4I, which are cross-sectional views of a chip scale package structure and a method for fabricating the same according to the present invention.

Figure 1:
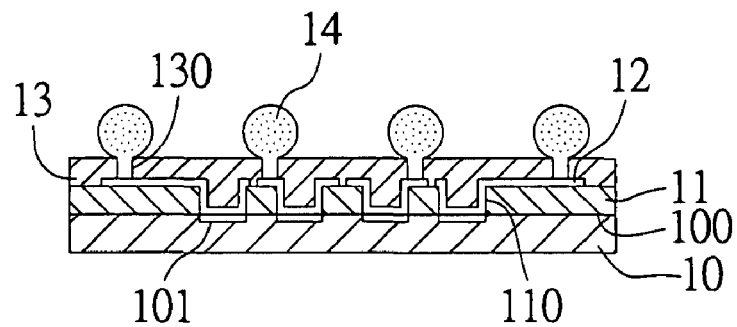
FIG. 1 is a diagram of a chip scale package structure of the prior art.
Figure 2:
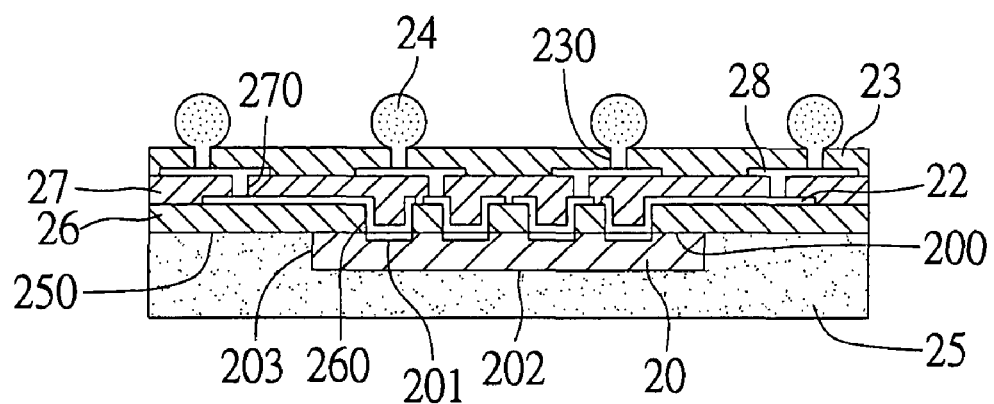
FIG. 2 is a diagram of a chip scale package structure according to the claims disclosed by U.S. Pat. No. 6,271,469.
Figure 3A:
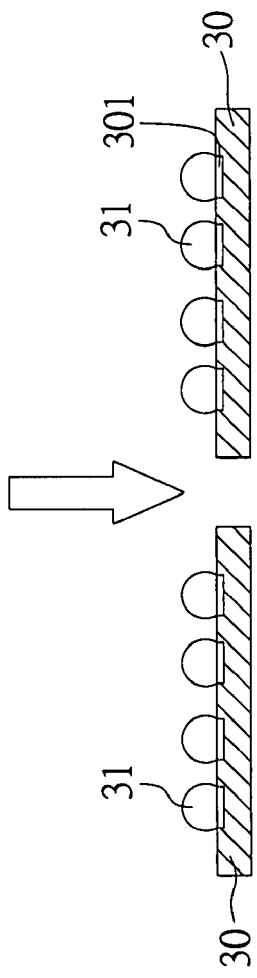
FIGS. 3A through 3D are sectional views of a chip scale package structure according to the claims disclosed by U.S. Pat. No. 7,002,245.
Figure 3B:
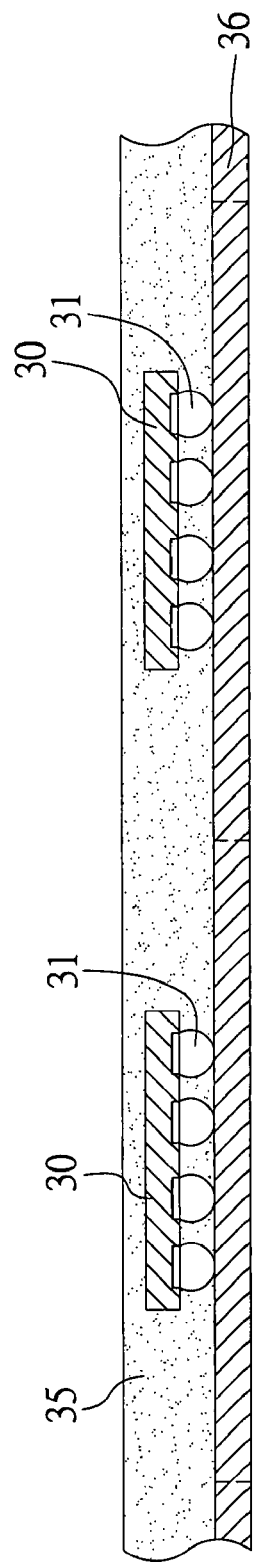
Figure 3C:
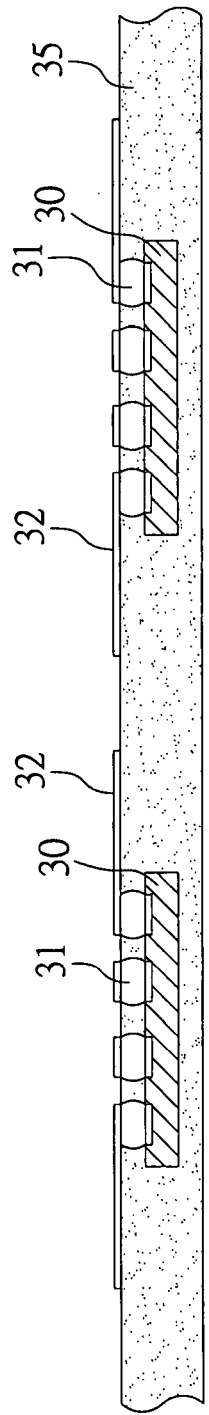
Figure 3D:
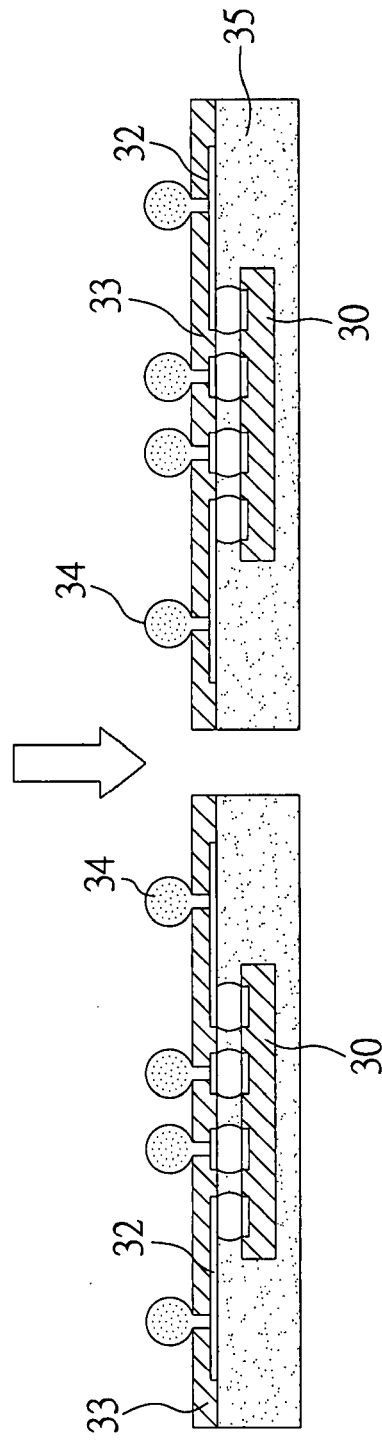
Figure 4A:
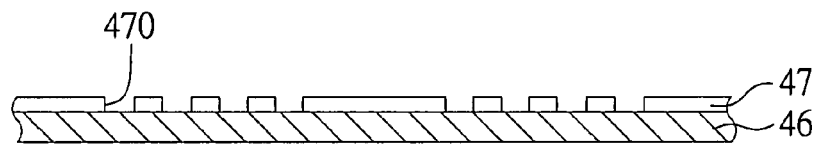
FIGS. 4A through 4I are side views of a chip scale package structure and a method for fabricating the same according to the present invention.

As shown in FIG. 4A, a metallic carrier 46 such as a copper plate is provided, and a resistance layer 47 is applied on the carrier 46. A plurality of openings 470 are formed on a predetermined part of the resistance layer 47 by patterning process, such as photo-lithography process, exposing, and developing, for exposing a predetermined part of a surface of the carrier 46.

Figure 4B:
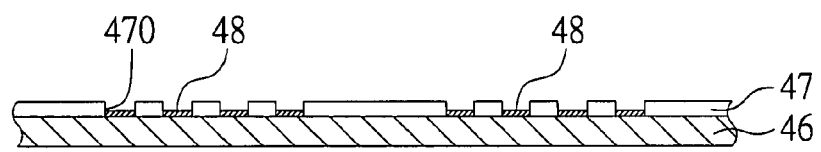

As shown in FIG. 4B, a plurality of metal pads 48 are deposited by an electroplating technique on the carrier 46 where the predetermined part of the surface is exposed by the openings 470. The metal pads 48 comprise gold (Au), palladium (Pd), or other metal.

Figure 4C:
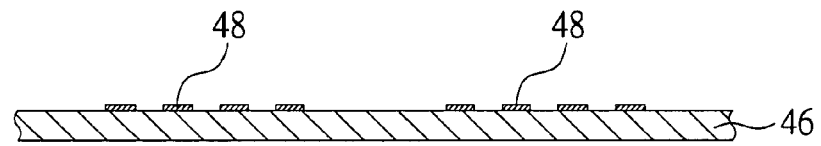

As shown in FIG. 4C, the resistance layer 47 is removed, and a plurality of metal pads 48 are accurately formed on the predetermined part of the surface of the carrier 46.

Figure 4D:
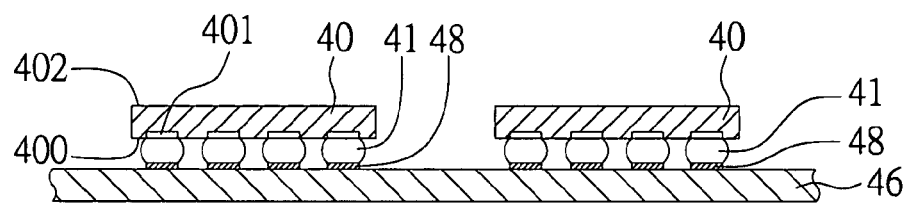

As shown in FIG. 4D, a plurality of chips 40 are mounted on the carrier 46. Each of the chips 40 has a plurality of conductive bumps 41, which are soldered to the metal pads 48 of the carrier 46 by a reflow process. Therefore, the chips 40 are accurately aligned on the carrier 46. Accordingly it is capable of avoiding the problems of high production cost, complicated fabrication process, and the practical incapability of effective mass production. Each of the chips 40 has an active surface 400 and an inactive surface 402 opposing to the active surface 400. The active surface 400 of each of the chips 40 is provided with a plurality of bond pads 401. A bumping or stud bumping step is then performed, and a conductive bump 41, such as a solder bump, a high lead solder bump, a gold bump and a gold stud bump, is formed on each of the bond pads 401 of the chip 40.

Figure 4E:
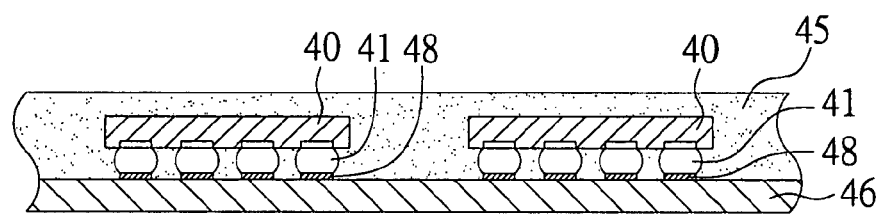

As shown in FIG. 4E, an encapsulant 45 is formed on the carrier 46 to encapsulate the chips 40 and the conductive bumps 41.

Figure 4F:
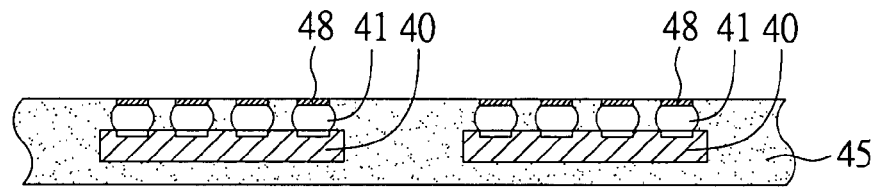

As shown in FIG. 4F, by means of etching or others, the metallic carrier (such as a copper plate) 46 is removed by an etching process, to expose the metal pads 48 outside the encapsulant 45 and to even the surfaces of the metal pads 48 uncovered by the encapsulant 45 and a surface of the encapsulant 45.

Figure 4G:
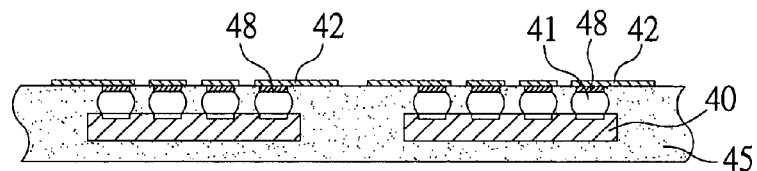

As shown in FIG. 4G, a plurality of first conductive traces 42 are formed by a patterning circuit process on the surface of the encapsulant 45, and electrically connected to the metal pads 48.

Figure 4H:
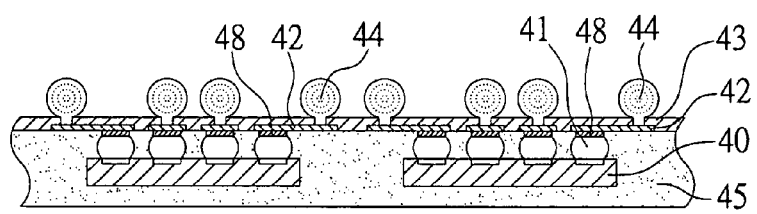

As shown in FIG. 4H, a solder mask 43 is applied on the first conductive traces 42, and is provided with a plurality of openings for exposing a predetermined part such as a terminal part of the first conductive traces 42.

Next, a plurality of conductive elements 44 are formed on each of the exposed parts (the terminal part) of the first conductive traces 42. The conductive elements 44 can be, for example, solder balls as shown in the figure, and serve as the input/output ends of the semiconductor package structure, thus the chips 40 can be electrically connected to external devices, such as a printed circuit board and others (not shown in the figure) via the conductive elements 44.

Figure 4I:
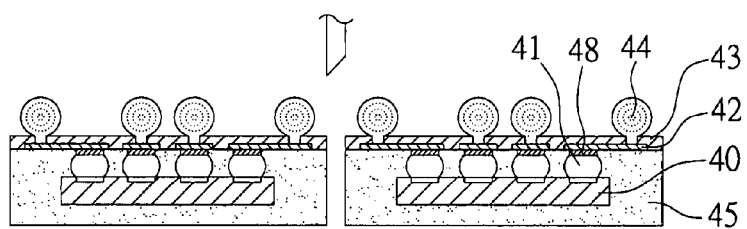

As shown in FIG. 4I, a cutting process is performed and the encapsulant 45 is cut and a plurality of chip scale package structures are formed, thus reaching the goal of mass production.

By means of the aforementioned method, the present invention also discloses a chip scale package structure, which comprises: a chip 40 having an active surface 400 and an inactive surface 402 opposing to the active surface 400, the active surface 400 being provided with a plurality of conductive bumps 41, the end of each of the conductive bumps 41 being provided with a metal pad 48; an encapsulant 45 encapsulating the chip 40 and the conductive bumps 41, the metal pad 48 on the end of each of the conductive bumps 41 being uncovered from the encapsulant 45 and being on the same level as one surface of the encapsulant; a plurality of first conductive traces 42 formed on the encapsulant 45 and electrically connected to the metal pads 48; a solder mask 43 applied on the first conductive traces 42 and provided with a plurality of openings for exposing a predetermined part of the first conductive traces 42; and a plurality of conductive elements 44 formed on the exposed predetermined part of the first conductive traces 42 and providing the chip 40 with the electricity connection to external devices.

Figure 5A:
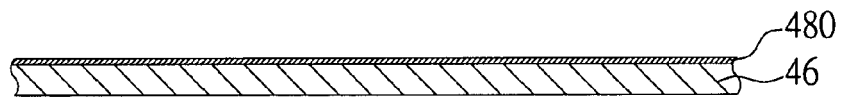
FIGS. 5A through 5D are diagrams, which illustrate a fabrication method of a carrier that has metal pads on its surface according to the present invention.
Figure 5B:
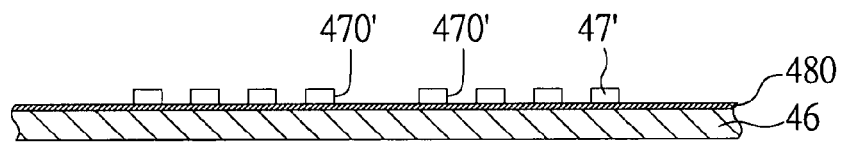
Figure 5C:
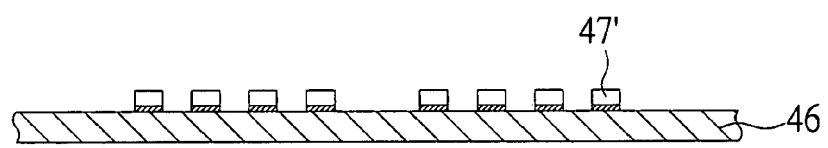
Figure 5D:
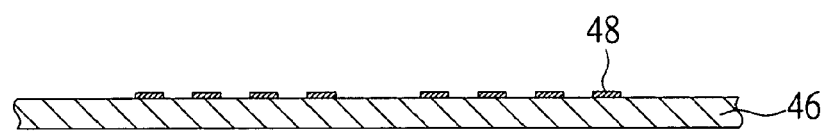

Please refer to FIGS. 5A through 5D. Another method for fabricating a carrier having predetermined metal pads comprise providing a carrier 46 such as a piece of glass, depositing a metal layer 480 such as gold (Au) or palladium (Pd) (as shown in FIG. 5A) on the carrier 46 by a sputtering process; removing part of the metal layer 480 by a patterning process. For example, applying an resistance layer 47' on the metal layer 480, and as shown in FIG. 5B, forming a plurality of openings 470' on the resistance layer 47' to expose the parts of the metal layer 480 to be removed, namely keeping the parts of the resistance layer 47' where the metal pads are to be formed underneath; as shown in FIG. 5C, removing the parts of the metal layer 480 uncovered from the resistance layer 47' by means of etching; and then, as shown in FIG. 5D, removing the remaining parts of the resistance layer 47', to form on the predetermined positions of the carrier 46 a plurality of metal pads 48.

Figure 6:
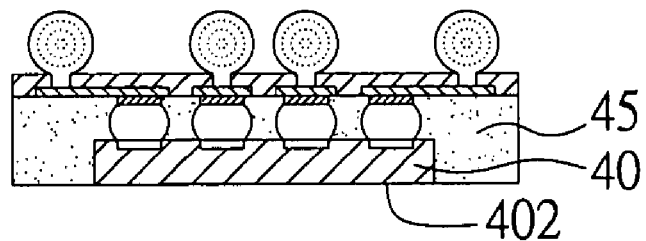
FIG. 6 is a diagram, which illustrates the second embodiment of a chip scale package structure according to the present invention.

Please refer to FIG. 6, which is a cross sectional view of the second embodiment of a chip scale package structure according to the present invention. As shown in FIG. 6, the chip scale package structure is similar to the one disclosed in the aforementioned embodiment, and the difference is that the part of the encapsulant 45 that covers the inactive surface 402 of the chip 40 can be ground and removed, and thus the inactive surface 402 of the chip 40 is exposed, this helping the heat produced by the operation of the chip 40 to dissipate into the environment, thereby enhancing the heat dissipation efficiency of the package structure.

Figure 7:
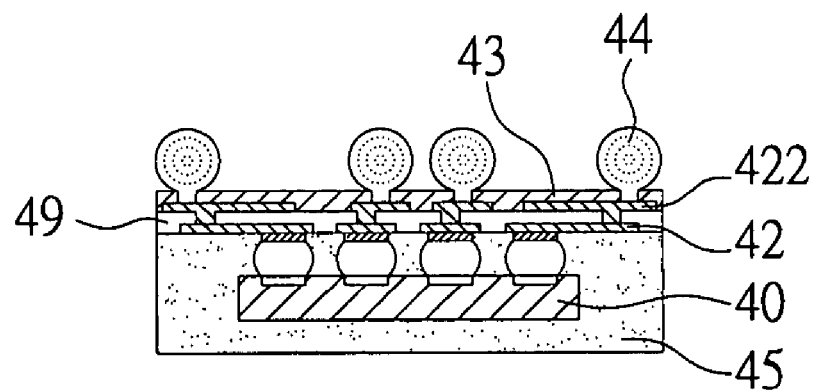
FIG. 7 is a diagram, which illustrates the third embodiment of a chip scale package structure according to the present invention.

Please refer to FIG. 7, which is a cross sectional view of the third embodiment of a chip scale package structure according to the present invention. As shown in FIG. 7, the chip scale package structure is similar to the ones disclosed in the aforementioned embodiments, the difference is that after the first conductive traces 42 are formed on the encapsulant 45, first applying at least a dielectric layer 49 on the top of the first conductive traces 42, and then forming a plurality of through holes that go through the dielectric layer 49, thus exposing the predetermined parts of the first conductive traces 42 through the through holes. Next, forming a plurality of second conductive traces 422 on the dielectric layer 49, and having each of the second conductive traces 422 be electrically connected to at least one exposed part of the first conductive traces 42.

After that, a solder mask 43 is applied on the second conductive traces 422, and then a plurality of openings are formed on the solder mask 43 to expose the predetermined parts of the second conductive traces 422. The exposed parts of the second conductive traces 422 can be a plurality of terminals. Next, a solder ball as a conductive element 44 is formed on each exposed part (the terminal) of the second conductive traces, the conductive elements 44 serve as the input/output ends of the package structure, and thus providing a plurality of electricity connections to the external devices. Therefore, the flexibility of the first conductive traces layout of the package structure can be enhanced by increasing the build-up layer number on the chip 40, and thus have the chip electrically connect to the external devices more effectively for operation.

Therefore, the chip scale package structure and its fabrication method of the present invention mainly first form a plurality of well-aligned metal pads on the predetermined positions of the carrier, thus the relative position of each metal pad can be accurately located, next, mount a plurality of chips on the carrier, wherein, each chip has a plurality of conductive bumps, and by soldering the conductive bumps to the corresponding metal pads of the carrier, each chip is accurately aligned on the carrier, thereby giving the benefit to the subsequent fabrication process, and accordingly avoiding the problems of high production cost, complicated fabrication process, and the practical incapability of effective mass production.

Next, proceed to the encapsulation process, form an encapsulant on the carrier to encapsulate the plurality of chips and the conductive bumps, and then remove the carrier to have the metal pads be uncovered from the encapsulant and be on the same level as one surface of the encapsulant, next, form a plurality of first conductive traces on the surface of the encapsulant, and then have first conductive traces electrically connect to the plurality of the metal pads; form a solder mask on the top of the plurality of the first conductive traces, and then open a plurality of apertures that go through the solder mask to expose the predetermined parts of the first conductive traces, form the conductive elements on the tops of the exposed predetermined parts of the first conductive traces, and at last cut the encapsulant into a plurality of chip scale package structures, thus reach the goal of mass production.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A method for fabricating a chip scale package structure, the method comprising:
   providing a carrier and forming a plurality of metal pads on a predetermined part of a surface of the carrier;
   mounting a plurality of chips on the carrier, each of the chips having a plurality of conductive bumps soldered to the metal pads;
   forming an encapsulant on the carrier to encapsulate the chips and the conductive bumps;
   removing the carrier to expose the metal pads and even the metal pads with a surface of the encapsulant;
   forming on the surface of the encapsulant a plurality of first conductive traces electrically connected to the metal pads;
   applying a solder mask on the first conductive traces, and forming a plurality of openings on the solder mask to expose a predetermined part of the first conductive traces;
   forming a plurality of conductive elements on the exposed predetermined part of the first conductive traces; and
   cutting the encapsulant to form a plurality of chip scale package structures.

2. The method of claim 1, wherein forming a plurality of metal pads on a predetermined part of a surface of the carrier comprises:
   forming a resistance layer on the carrier, and forming a plurality of openings on the resistance layer to expose a part of the carrier;
   forming a metal pad in each of the openings; and
   removing the resistance layer, so as to form the metal pads on the predetermined part of the carrier.

3. The method of claim 2, wherein the carrier is made of metal, and the metal pads are formed by means of electroplating.

4. The method of claim 1, wherein forming a plurality of metal pads on a predetermined part of a surface of the carrier comprises:
   depositing a metal layer on the carrier;
   applying a resistance layer on the metal layer, and forming a plurality of openings on the resistance layer to expose the parts of the metal layer to be removed, thus keeping the parts of the resistance layer where the metal pads are to be formed underneath;
   removing the parts of the metal layer that are not covered by the resistance layer; and
   removing the remaining resistance layer, thus the metal pads are formed on the predetermined positions of the carrier.

5. The method of claim 4, wherein the carrier is made of glass, and the metal layer is selected from the group of gold (Au) and palladium (Pd).

6. The method of claim 1, wherein the metal pads are selected from the group of gold (Au) and palladium (Pd).

7. The method of claim 1, wherein the part of the encapsulant that encapsulates the chips are ground and an inactive surface of each of the chips are exposed.

8. A method for fabricating a chip scale package structure, the method comprising:
provomg a carrier and forming a plurality of metal pads on a predetermined part of a surface of the carrier;
mounting a plurality of chips on the carrier, each of the chips having a plurality of conductive bumps soldered to the metal pads;
forming an encapsulant on the carrier to encapsulate the chips and the conductive bumps;
removing the carrier to expose the metal pads and even the metal pads with a surface of the encapsulant;
forming on the surface of the encapsulant a plurality of first conductive traces electrically connected to the metal pads;
applying a dielectric layer on the first conductive traces, predetermined parts of the first conductive traces being exposed outside the dielectric layer;
forming on the dielectric layer a plurality of second conductive traces, which are electrically connected to at least one exposed part of the first conductive traces;
applying a solder mask on the second conductive traces and exposing predetermined parts of the second conductive traces;
forming a plurality of conductive elements on the exposed parts of the second conductive traces; and
cutting the encapsulant to form a plurality of chip scale package structures.

9. The method of claim 8, wherein forming a plurality of metal pads on a predetermined part of a surface of the carrier comprises:
forming a resistance layer on the carrier, and forming a plurality of openings on the resistance layer to expose a part of the carrier;
forming a metal pad in each of the openings; and
removing the resistance layer, so as to form the metal pads on the predetermined part of the carrier.

10. The method of claim 9, wherein the carrier is made of metal, and the metal pads are formed by means of electroplating.

11. The method of claim 8, wherein forming a plurality of metal pads on a predetermined part of a surface of the carrier comprises:
depositing a metal layer on the carrier;
applying a resistance layer on the metal layer, and forming a plurality of openings on the resistance layer to expose the parts of the metal layer to be removed, thus keeping the parts of the resistance layer where the metal pads are to be formed underneath;
removing the parts of the metal layer that are not covered by the resistance layer; and
removing the remaining resistance layer, thus the metal pads are formed on the predetermined positions of the carrier.

12. The method of claim 11, wherein the carrier is made of glass, and the metal layer is selected from the group of gold (Au) and palladium (Pd).

13. The method of claim 8, wherein the metal pads are selected from the group of gold (Au) and palladium (Pd).

14. The method of claim 8, wherein the part of the encapsulant that encapsulates the chips are ground and an inactive surface of each of the chips are exposed.

* * * * *